(12) United States Patent
Wang

(10) Patent No.: US 10,502,965 B2
(45) Date of Patent: Dec. 10, 2019

(54) HIGH-EFFICIENCY MULTIWAVELENGTH BEAM EXPANDER EMPLOYING DIELECTRIC-ENHANCED MIRRORS

(71) Applicant: Corning Incorporated, Corning, NY (US)

(72) Inventor: Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 421 days.

(21) Appl. No.: 14/854,739

(22) Filed: Sep. 15, 2015

(65) Prior Publication Data

US 2016/0077346 A1   Mar. 17, 2016

Related U.S. Application Data

(60) Provisional application No. 62/051,354, filed on Sep. 17, 2014.

(51) Int. Cl.
  *G02B 5/08* (2006.01)
  *G02B 27/09* (2006.01)
  (Continued)

(52) U.S. Cl.
  CPC ........ *G02B 27/0983* (2013.01); *C23C 14/083* (2013.01); *C23C 14/10* (2013.01);
  (Continued)

(58) Field of Classification Search
  CPC .......... G02B 1/10; G02B 5/0816–0833; G02B 5/085–0858; G02B 5/0891; G02B 5/28;
  (Continued)

(56) References Cited

U.S. PATENT DOCUMENTS 4,881,068 A * 11/1989 Korevaar ........... G02B 27/2271
  345/6
5,172,277 A * 12/1992 Wahl .................... G02B 7/1815
  248/562
(Continued)

FOREIGN PATENT DOCUMENTS

DE   102012107456   2/2014
DE   10248707   5/2014
(Continued)

OTHER PUBLICATIONS

Jue Wang, et al. "HfO2/SiO2 enhanced diamond turned aluminum mirrors as high reflective IR laser optics," SPIE 8190, 8190005-1, (2011).
(Continued)

*Primary Examiner* — Arnel C Lavarias
(74) *Attorney, Agent, or Firm* — Kevin L. Bray

(57) ABSTRACT

A high-efficiency, multiwavelength beam-expander optical system that employs dielectric-enhanced mirrors is disclosed. Each mirror includes a reflective multilayer coating formed from alternating layers of $HfO_2$ and $SiO_2$ that define, in order from the substrate surface, at least first and second sections, wherein the $HfO_2/SiO_2$ layer thicknesses are generally constant within a given section and get smaller section by section moving outward from the substrate surface. The first and second sections are respectively configured to optimally reflect different operating wavelengths so that the beam-expander optical system has an optical transmission of greater than 95% at the different operating wavelengths.

14 Claims, 6 Drawing Sheets

(51) Int. Cl.
*G02B 19/00* (2006.01)
*G02B 1/10* (2015.01)
*C23C 14/10* (2006.01)
*C23C 14/08* (2006.01)
*C23C 14/22* (2006.01)

(52) U.S. Cl.
CPC ............... *C23C 14/22* (2013.01); *G02B 1/10* (2013.01); *G02B 5/0833* (2013.01); *G02B 5/0858* (2013.01); *G02B 5/0891* (2013.01); *G02B 19/0023* (2013.01)

(58) Field of Classification Search
CPC ........ G02B 5/281; G02B 5/283; G02B 5/285; G02B 7/182; G02B 17/0605–0621; G02B 17/0668; G02B 19/0023; G02B 19/0047; G02B 19/0085–0095; G02B 27/0983; G02B 5/0825; G02B 17/061; G02B 17/0615; G02B 17/0621; G02B 19/009; G02B 19/0095; H01S 3/005; H01S 3/0071; H01S 3/0092
USPC ....... 359/350, 351, 359, 360, 361, 364, 365, 359/366, 577, 580, 582, 584, 585, 586, 359/588, 589, 590, 641, 838, 850, 857, 359/858, 859
See application file for complete search history.

(56) References Cited

U.S. PATENT DOCUMENTS

| | | | |
|---|---|---|---|
| 6,022,114 A | 2/2000 | Foo | |
| 6,843,393 B2 | 1/2005 | Sinclair | |
| 7,212,336 B2* | 5/2007 | Chen | G02B 5/208 359/359 |
| 7,468,310 B2 | 12/2008 | Yamazaki et al. | |
| 7,683,650 B1 | 3/2010 | Baker et al. | |
| 7,706,078 B2 | 4/2010 | Tanaka | |
| 9,638,907 B2* | 5/2017 | Wallmeroth | G02B 17/0812 |
| 2003/0036750 A1 | 2/2003 | Ruiz et al. | |
| 2003/0046025 A1 | 3/2003 | Jamieson et al. | |
| 2004/0047055 A1* | 3/2004 | Mizrahi | G02B 5/0833 359/883 |
| 2004/0183018 A1 | 9/2004 | Zhou et al. | |
| 2005/0049129 A1 | 3/2005 | Belcastro et al. | |
| 2006/0196600 A1 | 9/2006 | Nam et al. | |
| 2007/0049476 A1 | 3/2007 | Belcastro et al. | |
| 2008/0037114 A1 | 2/2008 | Sheblee et al. | |
| 2009/0141358 A1 | 6/2009 | Cangemi et al. | |
| 2010/0202725 A1 | 8/2010 | Popovich et al. | |
| 2011/0002024 A1 | 1/2011 | Sheblee et al. | |
| 2011/0051121 A1 | 3/2011 | Degnan, III et al. | |
| 2011/0140008 A1 | 6/2011 | Bergstedt et al. | |
| 2013/0182445 A1 | 7/2013 | Loicq et al. | |
| 2015/0293275 A1 | 10/2015 | Crifasi et al. | |
| 2018/0017719 A1 | 1/2018 | D'Lallo et al. | |

FOREIGN PATENT DOCUMENTS

| | | |
|---|---|---|
| EP | 0272438 | 6/1990 |
| EP | 2320253 | 11/2011 |
| EP | 2463693 | 6/2012 |
| KR | 2009117092 A | 11/2009 |
| KR | 2010120383 A | 11/2010 |

OTHER PUBLICATIONS

International Search Report, issued in connection with corresponding PCT application No. PCT/US2015/050094, dated Jan. 7, 2016.

Jue Wang, Ron Davis, Angela Wang, Horst Schreiber, Scott J. Wilkinson, Joseph C. Crifasi, Robert D. Felock, "HfO2/SiO2 enhanced aluminum mirrors as high reflective IR laser optics," SPIE 8190, 8190005, (2011).

Jue Wang, Horst Schreiber, "Low loss dual-wavelength laser optics coatings at 1060nm and 530nm," SPIE 8016, 80160Y(2011).

Gao et al., "Damage on HfO2/SiO2 high-reflecting coatings under single and multiple Nd:Yag laser pulse irradiation," Mar. 10, 2005 / vol. 3, No. 3, Chinese Optics Letters, pp. 179-180.

* cited by examiner

HIGH-EFFICIENCY MULTIWAVELENGTH BEAM EXPANDER EMPLOYING DIELECTRIC-ENHANCED MIRRORS

This application claims the benefit of priority under 35 U.S.C. § 119 of U.S. Provisional Application Ser. No. 62/051,354 filed on Sep. 17, 2014 the content of which is relied upon and incorporated herein by reference in its entirety.

FIELD

The present disclosure relates to a beam expander, and in particular to a high-efficiency multiwavelength beam expander that employs dielectric-enhanced mirrors.

The entire disclosure of any publication or patent document mentioned herein is incorporated by reference, including U.S. Pat. No. 7,683,450, entitled "Method for producing smooth dense optical films" and which is referred to below as the '450 patent, and the article by Wang et al., "$HfO_2$/$SiO_2$ enhanced diamond turned aluminum mirrors for IR laser optics," Proc. SPIE 8190, 8190005 (2011).

BACKGROUND

Beam expanders are used to enlarge the size of a beam of light. Beam expanders are often used in laser applications where a laser beam from a light source starts out having a very small diameter but needs to be expanded in at least one direction for use downstream. In many cases, the laser beam has a high intensity and needs to be expanded to avoid damaging the downstream optical components.

Some beam expanders are catoptric optical systems, i.e., all of the optical components are reflective. Reflective optical elements are often preferred for beam expanders that operate at multiple wavelengths because they do not suffer from chromatic aberration and therefore do not require color correction.

FIG. 1 is a plot of the reflectance R (%) versus wavelength λ (nm) for a diamond-turned and optically polished aluminum mirror having a mirror substrate made of aluminum alloy (Al 6061-T6). The mirror includes a conventional quarter-wavelength $HfO_2$/$SiO_2$ multilayer reflective coating optimized at λ=1064 nm. The plot shows a broadband spectral reflectance from the ultraviolet (UV) to the near infrared (NIR), with reflectances R of 92.3% at 355 nm, 92.0% at 532 nm and 95.0% at 1064 nm. The three wavelengths selected are the common output wavelengths for a high-power Nd:YAG laser. The reflectance R at 355 nm has a bandwidth of only 24 nm. In the visible spectral range, the average reflectance is similar to that of bare aluminum.

For a beam expander that uses two of the aluminum mirrors having the reflectance properties of FIG. 1, the optical transmittance is 85.2% at 355 nm, 84.6% at 532 nm and 90.3% at 1064 nm. There are three main drawbacks associated with such a multiband laser beam expander, namely, a relatively low optical transmittance, a low laser-damage resistance, and susceptibility to surface degradation over time when exposed to extreme environments.

A beam expander for use with high-power lasers needs to have much higher optical transmittance (e.g., >95%) at each of the designated (operating) wavelengths, and preferably is resistant to laser-damage resistance and relatively insusceptible to surface degradation.

SUMMARY

An aspect of the disclosure is a beam-expander optical system that includes: a convex mirror having a first mirror substrate made of metal and having a convex substrate surface and a first reflective multilayer coating formed on the convex substrate surface; and a concave mirror having a second mirror substrate made of the metal and having a concave substrate surface and a second reflective multilayer coating formed on the concave substrate surface, with the convex and concave mirrors being arranged in an off-axis, afocal configuration having greater than unity magnification. The first and second reflective multilayer coatings each includes alternating layers of $HfO_2$ and $SiO_2$ that define at least first and second sections S1 and S2. The first section S1 is closest to the convex or concave substrate surface and is configured to optimally reflect a first wavelength of light and substantially transmit mid-wavelength IR (MWIR) light. The second section S2 resides atop the first section and is configured to optimally reflect a second wavelength of light that is shorter than the first wavelength of light. The second section S2 also substantially transmits the MWIR light. The beam-expander optical system has a high-efficiency transmittance $T_{BE}$>95% for the first and second wavelengths of light.

Another aspect of the disclosure is the beam-expander optical system as described above, wherein the first and second multilayer coatings each includes a third section S3 atop the second section S2. The third section S3 is configured to optimally reflect a third wavelength of light that is shorter than the second wavelength of light and substantially transmit the MWIR light. In an example, the first wavelength of light is an infrared wavelength, the second wavelength of light is a visible wavelength and the third wavelength of light is an ultraviolet wavelength.

Another aspect of the disclosure is a high-efficiency beam-expander optical system for use at UV, VIS and IR operating wavelengths. The beam-expander optical system includes: a first mirror with a convex substrate surface formed on a first Al alloy substrate and a second mirror with a concave substrate surface formed on a second Al alloy substrate. The first and second mirrors are arranged in an off-axis, afocal configuration having greater than unity magnification. The convex and concave substrate surfaces each include a multilayer reflective coating formed from alternating layers of $HfO_2$ and $SiO_2$ having respective layer thicknesses $\tau_H$ and $\tau_S$. Each multilayer reflective coating includes: i) a first section immediately adjacent the convex or concave reflective surface and configured to optimally reflect the IR operating wavelength and substantially transmit a mid-wavelength IR (MWIR) wavelength; ii) a second section atop the first section and configured to optimally reflect the VIS operating wavelength and substantially transmit the IR and MWIR operating wavelengths; and iii) a third section atop the second section and configured to optimally reflect the UV operating wavelength and substantially transmit the VIS, IR and MWIR wavelengths. The respective $HfO_2$ and $SiO_2$ layer thicknesses $\tau_H$ and $\tau_S$ are substantially constant within each section but the thicknesses in the second section are smaller on average than those in the first section and the thicknesses in the third section are smaller on average than those in the second section. The beam-expander optical system has a transmittance $T_{BE}$>95% at the UV light, the VIS light and the IR operating wavelengths.

Another aspect of the disclosure is a method of forming a high-efficiency beam-expander optical system for use at UV, VIS and IR operating wavelengths. The method includes: diamond-turning and polishing first and second metal substrates to respectively form a first mirror having a convex substrate surface and a second mirror having a concave substrate surface; forming on each of the convex and concave substrate surfaces a reflective multilayer coating consisting of alternating layers of $HfO_2$ and $SiO_2$ having respective layer thicknesses $\tau_H$ and $\tau_S$, including arranging the $HfO_2$ and $SiO_2$ layers in at least three sections S1, S2 and S3 in order outward from the convex or the concave surface, the three sections being respectively configured to optimally reflect the IR, VIS and UV operating wavelengths; and arranging the first and second mirrors in an off-axis, afocal configuration having greater than unity magnification and an optical transmittance $T_{BE}$>95% at each of the UV, VIS and IR operating wavelengths. In an example, the metal mirror substrates are made of an aluminum alloy.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s) and together with the Detailed Description serve to explain the principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this detailed description.

Cartesian coordinates are shown in some of the Figures for the sake of reference and are not intended to be limiting as to direction or orientation.

The acronym "SWIR" stands for "short-wavelength infrared" and represents an example wavelength range from about 900 nm to about 1700 nm. Likewise, the acronym "MWIR" stands for "mid-wavelength infrared" and represents an example wavelength range from about 1700 nm to about 5000 nm. The acronym "IR" stands for "infrared" and can include NIR, SWIR and MWIR wavelengths unless otherwise noted. The acronym "RMS" stands for "root-mean square."

Also in the discussion below, the term "operating wavelength" is denoted λ and means a wavelength for which the beam expander and the mirrors therein are designed to be used. In the examples below, the beam expander is designed to work for at least three operating wavelengths λ in the ultraviolet (UV), visible (VIS) and infrared (IR) ranges, respectively. In an example, the operating wavelengths are those that can be generated by a high-power Nd:YAG laser, including by frequency multiplication and/or frequency modification techniques known in the art.

It will be understood by those skilled in the art that the operating wavelength has an attendant "operating waveband" or "operating bandwidth" or "linewidth" $\Delta\lambda$ about the operating wavelength, which in an example is defined by the bandwidth of the light source (or light sources) that generates/generate light of the operating wavelengths $\lambda$. A typical linewidth $\Delta\lambda$ of an Nd:YAG laser is less than 1 nm.

The alternating layers of $HfO_2$ and $SiO_2$ are described herein using the shorthand notation "$HfO_2/SiO_2$," and in like manner the respective thicknesses $\tau_H$ and $\tau_S$ of the alternating layers are denoted $\tau_H/\tau_S$.

The term "high efficiency" as used in connection with the beam expander disclosed herein means that the beam expander has an optical transmittance $T_{BE}>95\%$ at each of the operating wavelengths for which the beam expander was designed.

Also, the term "optimally reflect," when used in connection with a given operating wavelength and a section SN of the $HfO_2/SiO_2$ layers, is understood as being measured relative to the other operating wavelengths, so that the given operating wavelength is understood as having a higher reflectance than the other operating wavelengths.

High-Efficiency Beam Expander

Figure 1:
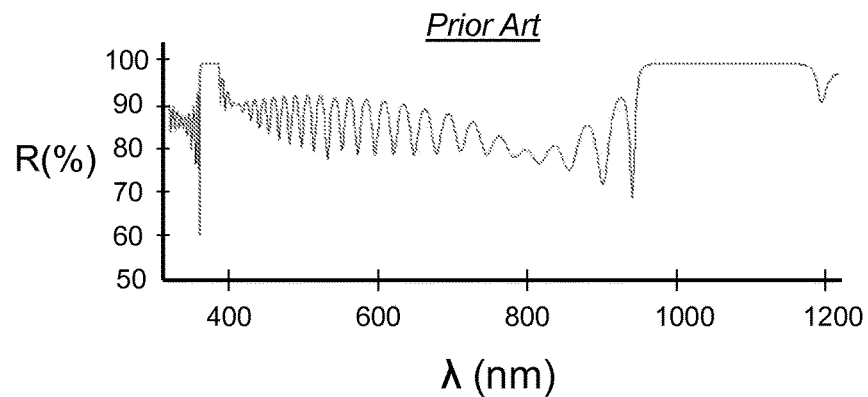
FIG. 1 is a plot of the reflectance R (%) versus wavelength λ (nm) for a diamond-turned and optically polished aluminum mirror having a mirror substrate made of an aluminum alloy (Al 6061-T6) and including a conventional quarter-wavelength $HfO_2/SiO_2$ multilayer reflective coating optimized at λ=1064 nm, wherein the plot illustrates relatively low reflectances at operating wavelengths λ of 355 nm and 532 nm.
Figure 2:
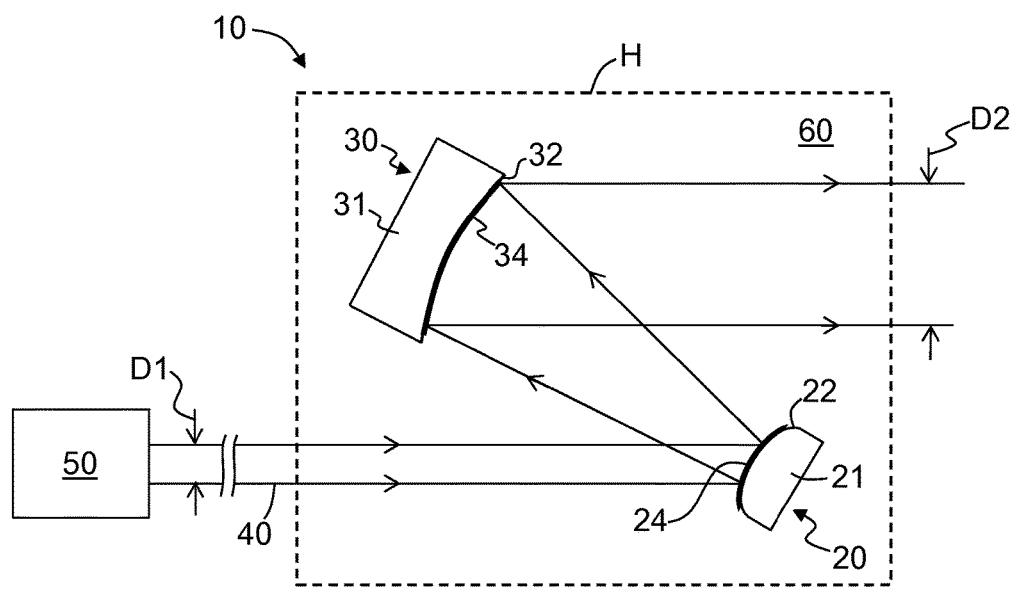
FIG. 2 is a schematic diagram of an example two-mirror, off-axis beam expander according to the disclosure, shown along with a laser source, wherein each mirror includes the $HfO_2/SiO_2$ reflective multilayer coating as disclosed herein that provides the beam expander with an optical transmittance $T_{BE}$>95% for ultraviolet, visible and infrared operating wavelengths.

FIG. 2 is a schematic diagram of an example beam-expander optical system ("beam expander") 10 that includes two off-axis mirrors 20 and 30. The mirror 20 includes a mirror substrate 21 with a convex substrate surface 22 that supports a reflective multilayer coating 24 having a top surface 26. The mirror 30 includes a mirror substrate 31 with a concave substrate surface 32 that supports a reflective multilayer coating 34 having a top surface 36. In an example, top surfaces 26 and 36 interface with an ambient environment 60 that includes air or vacuum having a nominal refractive index of n=1. In an example, top surfaces 26 and 36 define respective "mirror surfaces" or "reflective surfaces" for mirrors 20 and 30.

In an example, reflective multilayer coatings 24 and 34 have the same structure, in which case the different reference numbers for the coatings denote on which mirror substrate 21 or 31 the reflective multilayer coating resides. As discussed in greater detail below, reflective multilayer coatings 24 and 34 are made up of layers of the dielectric materials $HfO_2$ and $SiO_2$. The $HfO_2/SiO_2$ layers are configured to enhance the reflectance of mirrors 20 and 30 so that beam expander 10 can have a high-efficiency optical transmittance $T_{BE}$ of greater than 95% for UV, VIS and IR light.

In an example, beam expander 10 includes a housing H that operably supports mirrors 20 and 30. In an example, housing H is made of diamond-turned lightweight metal, such an aluminum alloy, and mirrors 20 and 30 are formed such that they are integral with the housing to provide mechanical and thermal stability.

In an example, mirror substrates 21 and 31 are made of metal. Example metals include non-ferrous metals that can be diamond turned, and in particular include nickel and nickel alloys, magnesium and magnesium alloys, copper and copper alloys, and aluminum and aluminum alloys. In an example, the metal is a lightweight metal such as aluminum, an aluminum alloy, magnesium or a magnesium alloy, so that the beam expander 10 can be made lightweight.

The beam expander 10 is configured to receive a collimated laser beam 40 of a first diameter D1 and form therefrom an expanded, collimated laser beam of diameter D2. The beam expander 10 thus has an afocal configuration with a magnification $M_{BE}=D2/D1$. For beam expansion, $M_{BE}>1$, i.e., beam expander 10 has greater than unity magnification. In an example, collimated laser beam 40 originates from a high-power laser 50 that can emit wavelengths over multiple operating wavelengths (and thus wavelength bands) in the UV, VIS and IR ranges, e.g., 355 nm, 532 nm and 1064 nm.

In an example, mirror substrates 21 and 31 are made of a lightweight metal, such as an aluminum alloy, e.g., Al 6061-T6. In an example, substrate surfaces 22 and 32 are diamond turned to define the respective convex and concave curvatures. As noted above, in an example, mirror substrates 21 and 31 can be defined by housing H and are formed integrally therewith. In an example, mirrors 20 and 30 are spherical mirrors, while in other examples they can have different shapes, such as aspheric, cylindrical, anamorphic, etc.

$HfO_2/SiO_2$ Multilayer Coatings

Figure 3:
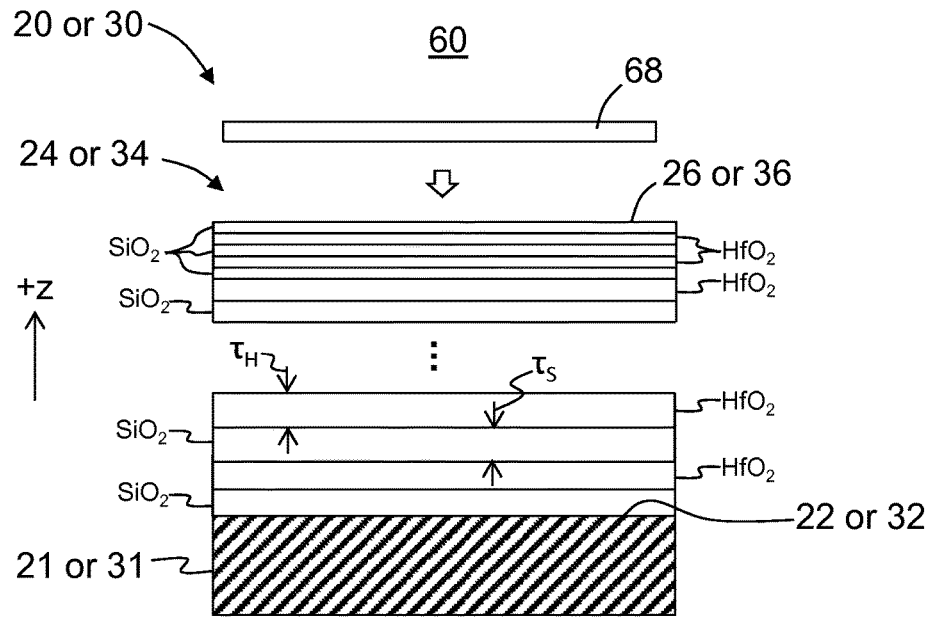
FIG. 3 is a close-up, cross-sectional view of an example mirror used in the beam expander of FIG. 2 and shows a portion of the mirror substrate and the corresponding reflective multilayer coating formed thereon, illustrating how the coating layers have a thickness that generally decreases with distance (z-direction) from the substrate surface.

In an example, reflective multilayer coatings 24 and 34 are each formed from alternating layers of $HfO_2$ and $SiO_2$, denoted as $HfO_2/SiO_2$. FIG. 3 is a close-up, cross-sectional view of either mirror 20 or mirror 30 and shows a portion of mirror substrate 21 or 31 and the corresponding reflective multilayer coating 24 or 34. The +z-direction is perpendicular to substrate surface 22 or 32 as shown. The $HfO_2/SiO_2$ layers have respective thicknesses $\tau_H$ and $\tau_S$, which in analogous fashion are denoted in shorthand as $\tau_H/\tau_S$. In the discussion below, the $HfO_2/SiO_2$ layers that define reflective multilayer coatings 24 and 34 are divided up into N sections SN, e.g., sections S1, S2, . . . , SN, with section S1 being immediately adjacent (i.e., closest to) substrate surface 22 or 32. The thicknesses $\tau_H/\tau_S$ of the $HfO_2/SiO_2$ layers in a given section SN are denoted SN ($\tau_H/\tau_S$) for ease of discussion. The average thicknesses $\tau_H/\tau_S$ of the $HfO_2/SiO_2$ layers in a given section SN are denoted $SN(\tau_H/\tau_S)_{AVG}$.

A characteristic of reflective multilayer coatings 24 and 34 is that the thicknesses $\tau_H/\tau_S$ of the $HfO_2/SiO_2$ layers generally change with distance in the +z direction, i.e., in the direction away from substrate surface 22 or 32 to top surface 26 or 36 of the reflective multilayer coating. In an example, the changes in thicknesses $\tau_H/\tau_S$ can occur in a stepped fashion, i.e., wherein within each section SN the layer thicknesses $\tau_H/\tau_S$ are substantially constant but change from section to section. Also, there can be some variation in the layer thicknesses $\tau_H/\tau_S$ in a given section SN wherein most but not all of the layer thicknesses $\tau_H$ are substantially the same and most but not all of the layer thickness $\tau_S$ are substantially the same. In an example, $SN(\tau_H/\tau_S)_{AVG}>SN+1(\tau_H/\tau_S)_{AVG}$, i.e., the average thicknesses $\tau_H/\tau_S$ within a given section SN are greater than those of the overlying section SN+1. So, for example, if reflective multilayer coatings 24 and 34 are divided into three sections S1, S2 and S3, then in the example, $S1(\tau_H/\tau_S)_{AVG}>S2(\tau_H/\tau_S)_{AVG}>S3(\tau_H/\tau_S)_{AVG}$.

Figure 4:
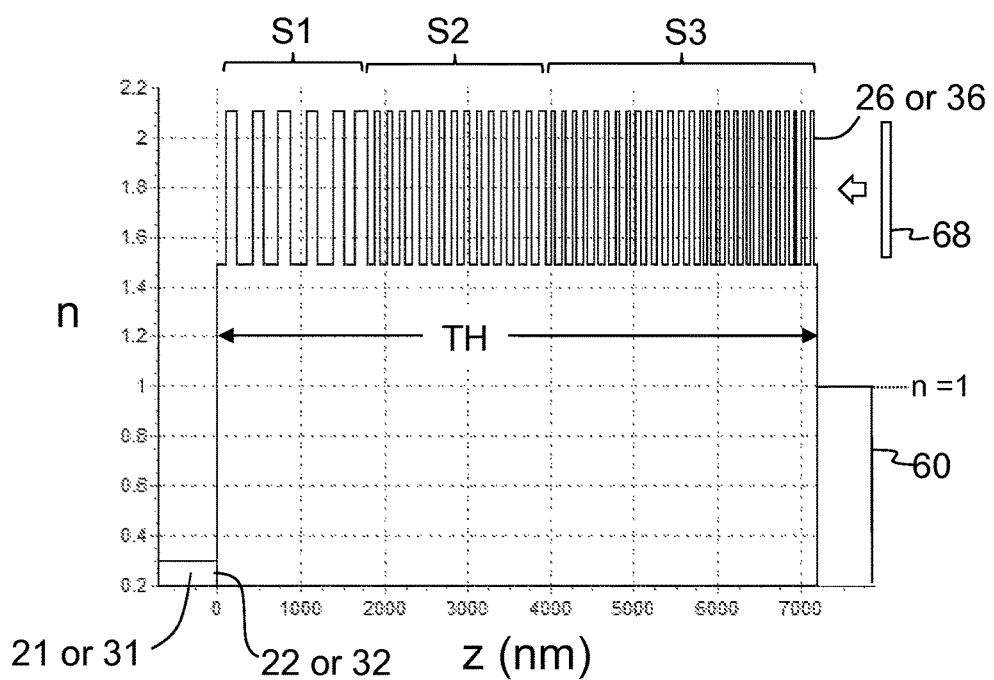
FIG. 4 is a plot of the refractive index n (at 355 nm) versus the distance z (nm), illustrating an example of how the $HfO_2/SiO_2$ layers of the reflective multilayer coating define different sections S1 through S3 having different (average) layer thicknesses.

FIG. 4 is a plot of the refractive index n (at $\lambda=355$ nm) versus distance z (nm) that shows an example of the varying thicknesses of the different $SiO_2$ and $HfO_2$ layers, as well as the overall thickness of reflective multilayer coating 24 or 34. The $SiO_2$ layers have a refractive index n of about 1.5 while the $HfO_2$ layers have a refractive index of about 2.1. In an example, the $SiO_2$ layers generally decrease in thickness $\tau_S$ in stepwise fashion between sections S1 and S3, e.g., from 90 nm$\leq\tau_S\leq$190 nm in section S1 to 60 nm$\leq\tau_S\leq$70 nm in section S3. Likewise, the $HfO_2$ layers generally decrease in thickness $\tau_H$ between sections S1 and S3, e.g., from $130 \leq \tau_H \leq 140$ nm in section S1 to $40$ nm $\leq \tau_H \leq 50$ nm in section S3.

Table 1 below summarizes example ranges for the thicknesses $\tau_S$ and $\tau_H$ in each of the sections S1, S2 and S3.

TABLE 1

Summary of $\tau_S$ and $\tau_H$ for sections S1, S2 and S3

| Thickness | S1 (IR) | S2 (VIS) | S3 (UV) |
|---|---|---|---|
| $\tau_S$ | 90 nm to 140 nm | 70 nm to 90 nm | 60 nm to 70 nm |
| $\tau_H$ | 130 nm to 140 nm | 50 nm to 70 nm | 40 nm to 50 nm |

The reflective multilayer coating 24 or 34 of FIG. 4 has an overall thickness TH as measured from substrate surface 22 or 32 to top surface 26 or 36 of about 7250 nm. In an example, a relatively thick $SiO_2$ layer 68 may be added as an outermost capping layer that defines top surface 26 or 36 and that further increase durability to laser irradiation. Likewise, FIG. 4 shows that the $SiO_2$ layer immediately adjacent substrate surface 22 or 32 is thinner (e.g., 90 nm) than the next $SiO_2$ layer (e.g., 180 nm or 190 nm). So, as emphasized above, there can be some variation in the thicknesses $\tau_H/\tau_S$ of the $HfO_2/SiO_2$ layers in a given section SN.

Figure 5:
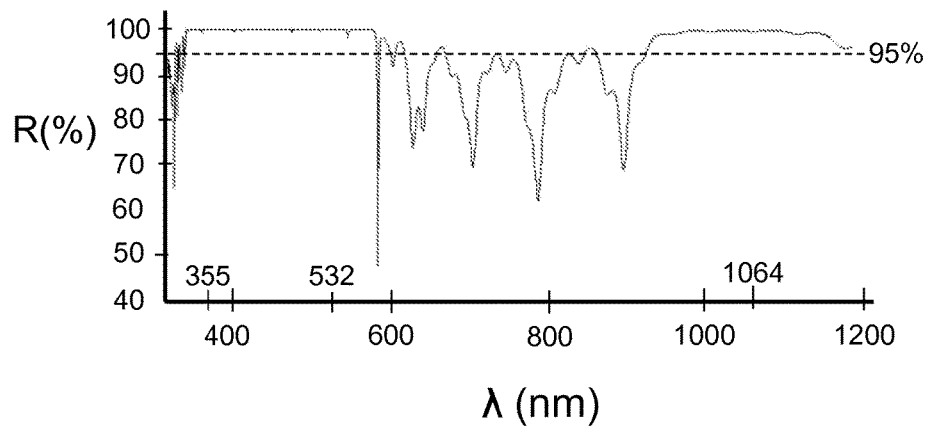
FIG. 5 is a plot of the reflectance R (%) versus wavelength λ (nm) for an example beam-expander mirror with a reflective multilayer coating having a varying-thickness configuration such as shown in FIG. 4.

FIG. 5 is a plot of the reflectance R (%) versus wavelength $\lambda$ (nm) for an example "triple band" reflective multilayer coating 24 or 34 designed for use at operating wavelengths $\lambda$ of 355 nm (UV), 532 nm (VIS) and 1064 nm (IR). The horizontal dashed line shows the R=95% reflectance value, and it can be seen that the reflectance R is greater than 95% for each of the wavelengths $\lambda$ of interest.

Figure 6:
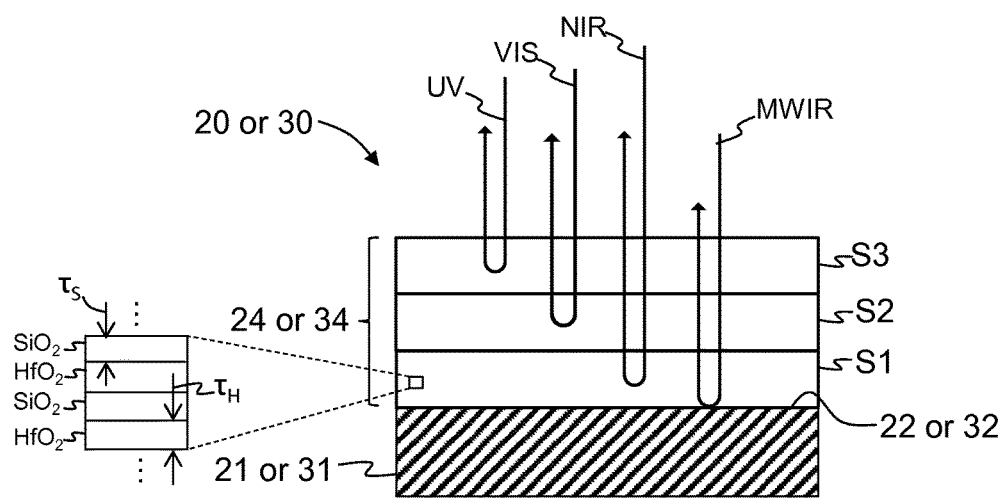
FIG. 6 is a cross-sectional diagram of an example beam-expander mirror illustrating how the reflective multilayer coating includes three sections S1, S2 and S3, with the uppermost section S3 reflecting UV light, the middle section S2 reflecting visible light, and the lowermost section S1 reflecting NIR light, while the substrate surface reflects MWIR light.

FIG. 6 is a schematic diagram of an example configuration of reflective multilayer coating 24 or 34 that illustrates the operation of the multilayer coating in providing such high reflectance at the three example operating wavelengths of interest ($\lambda$=355 nm, 532 nm and 1064 nm), as well as MWIR wavelengths that pass through the reflective multilayer coating and reflect from substrate surface 22 or 32. The reflectance of the MWIR wavelengths from substrate surface 22 or 32 (e.g., R>92% or R>95%) enables these wavelengths to be transmitted through beam expander 10, e.g., in the opposite direction of laser beam 40. In an example, this allows for detecting targets (not shown) at the MWIR wavelengths through beam expander 10, with the signal-to-noise ratio being defined by the beam expansion ratio or magnification M=D2/D1.

The example reflective multilayer coating 24 or 34 of mirror 20 or 30 shown in FIG. 6 is divided into three sections S1, S2 and S3, with section S1 being configured to provide a high reflectance R (i.e., optimally reflect) for the NIR operating wavelength of $\lambda$=1064 nm while being substantially transmissive to MWIR wavelengths. The close-up inset shows the $HfO_2/SiO_2$ layers in section S1. The sections S2 and S3 also include the $HfO_2/SiO_2$ layers, wherein $S1(\tau_H/\tau_S)_{AVG} > S2(\tau_H/\tau_S)_{AVG} > S3(\tau_H/\tau_S)_{AVG}$.

Section S1 has an $HfO_2/SiO_2$ multilayer structure with the thickest $HfO_2/SiO_2$ layers (on average), e.g., the thickness $\tau_H$ is in the range from 130 nm to 140 nm for most if not all of the $HfO_2$ layers and the thickness $\tau_S$ is in the range from 90 nm to 190 nm for most if not all of the $SiO_2$ layers.

Section S2 is the middle section and is configured to provide a high reflectance R (i.e., to be optimally reflective) in the visible (VIS) operating wavelength of $\lambda$=532 nm while being substantially transmissive for the NIR and the MWIR wavelengths. The $HfO_2/SiO_2$ layers in section S2 have intermediate thicknesses $\tau_H$ and $\tau_S$, e.g., a thickness $\tau_H$ in the range from 50 nm to 70 nm for most if not all of the $HfO_2$ layers and a thickness $\tau_S$ in the range from 70 nm to 90 nm for most if not all of the $SiO_2$ layers.

Section S3 is the uppermost section and is configured to provide a high reflectance R (i.e., to be optimally reflective) at the UV operating wavelength of $\lambda$=355 nm while being substantially transmissive for the VIS, the NIR and the MWIR wavelengths. Section S3 has the thinnest $HfO_2/SiO_2$ layers, e.g., a thickness $\tau_H$ in the range from 40 nm to 50 nm for most if not all of the $HfO_2$ layers and a thickness $\tau_S$ in the range from 60 nm to 70 nm for most if not all of the $SiO_2$ layers. To facilitate manufacturability of the mirror, the UV and VIS bands are connected in the design. As noted above, a thick $SiO_2$ layer 68 may be added as an outmost capping layer atop section S3 to further increase durability to laser irradiation.

Figure 7:
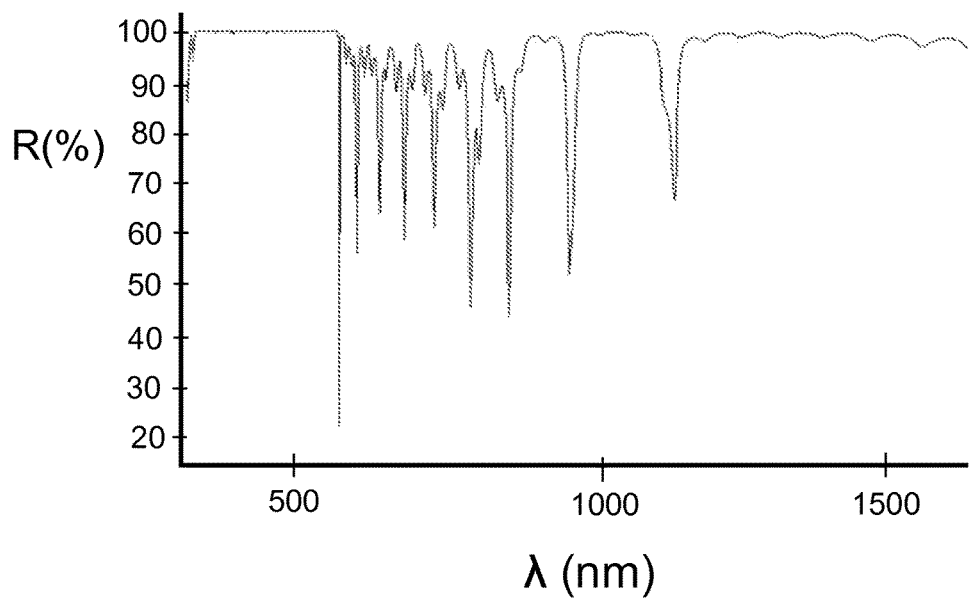
FIG. 7 is a plot of the reflectance R (%) versus wavelength λ (nm) illustrating an example reflectance spectrum for an example beam-expander mirror having a reflective multilayer stack configured for high-efficiency reflectance at operating wavelengths λ of 355 nm, 532 nm and 1064 nm, as well as at SWIR wavelengths.
Figure 8:
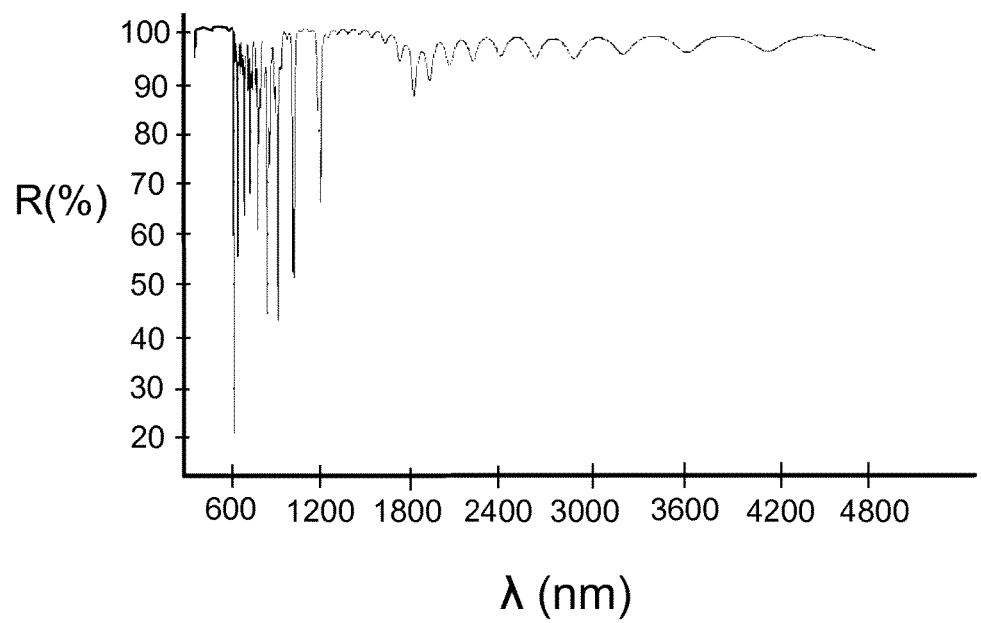
FIG. 8 is similar to FIG. 7 and illustrates an example reflectance spectrum for an example beam-expander mirror having a reflective multilayer stack configured for high-efficiency reflectance at operating wavelengths λ of 355 nm, 532 nm, 1064 nm, SWIR wavelengths and MWIR wavelengths.

The above-described method of forming reflective multilayer coating 24 or 34 in sections SN, with each section configured to have a select reflectance R for a given operating wavelength, can be used to design mirrors 20 and 30 for use in beam expander 10. FIG. 7 is a plot of the reflectance R (%) versus wavelength $\lambda$ for an example reflective multilayer coating 24 or 34 with a high reflectance at operating wavelengths $\lambda$ of 355 nm, 532 nm, and 1064 nm as well as at SWIR wavelengths. FIG. 8 is similar to FIG. 7 and plots the reflectance R (%) at operating wavelengths $\lambda$ of 355 nm, 532 nm, 1064 nm and at SWIR wavelengths while the substrate surface 22 or 32 has high-reflectance at MWIR wavelengths that are substantially transmitted by the different sections SN of the reflective multilayer coating 24 or 34.

Controlling Loss Due to Scattering

In an example embodiment, reflective multilayer coatings 24 and 34 each has a reflectance of 98% or greater at each of the UV, VIS and IR operating wavelengths $\lambda$, and beam expander 10 has an optical transmittance $T_{BE}$>95%, which makes it a high-efficiency optical system. To achieve this high reflectance for mirrors 20 and 30 and high efficiency for beam expander 10, the amount of loss due to scattering for each mirror needs to be controlled.

In the reflectance plot of FIG. 5, a reflectance R of greater than 99.9% can in theory be achieved at all of the "triple bands," i.e., at $\lambda$=355 nm, 532 nm and 1064 nm, by having a perfect substrate surface and by coating interfaces having zero RMS surface roughness.

Figure 9:
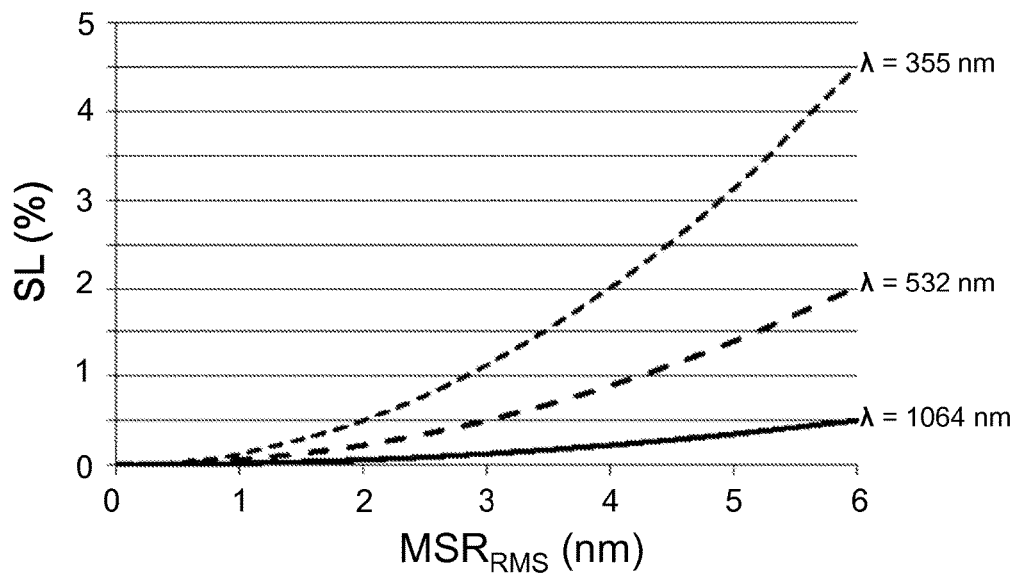
FIG. 9 is a plot of the scattering loss SL (%) versus the root-mean-square (RMS) substrate surface roughness $MSR_{RMS}$ (nm) for different operating wavelengths λ of 355 nm, 532 nm and 1064 nm, illustrating the impact of the substrate surface roughness on the scattering loss due to optical scattering of light at the different operating wavelengths.

In practice, however, substrate surfaces and coating interfaces have some degree of surface roughness that diminishes the reflectance. FIG. 9 is a plot of the scatter loss SL (%) for a single mirror 20 or 30 as a function of the RMS substrate surface roughness $MSR_{RMS}$ (nm) at the operating (design) wavelengths $\lambda$=355 nm, 532 nm and 1064 nm. The plot shows that the scatter loss SL is zero when the RMS substrate surface roughness $MSR_{RMS}$ is zero, i.e., for a perfect surface. The scatter loss SL increases as the RMS substrate surface roughness $MSR_{RMS}$ increases. For example, when $MSR_{RMS}$=3 nm, the scatter loss SL is 0.22% at 1064 nm, 0.50% at 532 nm and 1.13% at 355 nm. For $MSR_{RMS}$=6 nm, the scatter loss SL is 0.62% at 1064 nm, 2% at 532 nm and 4.5% at 355 nm.

Figure 10:
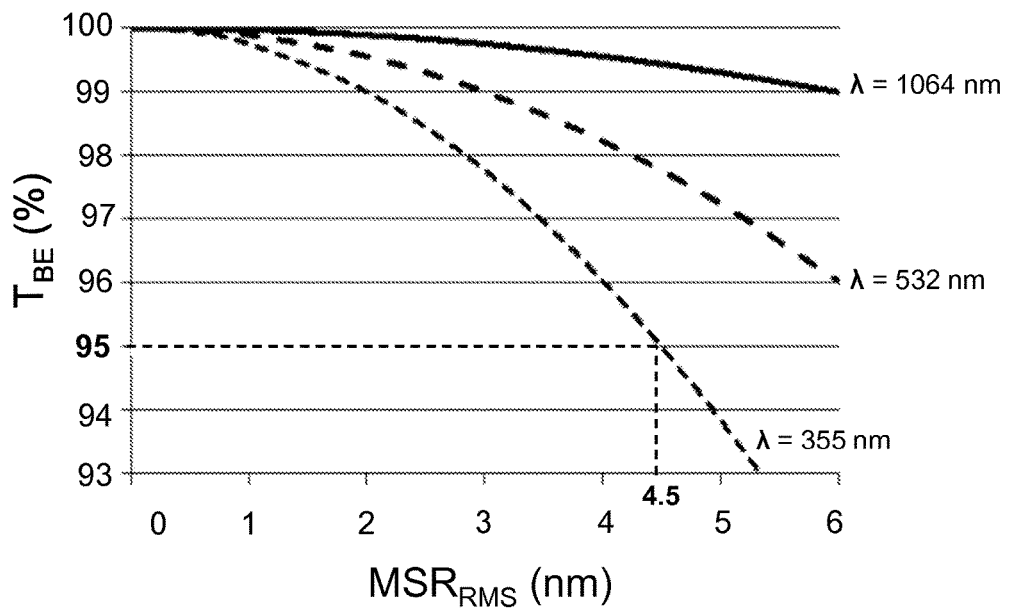
FIG. 10 is a plot of the optical transmittance $T_{BE}$ (%) of the beam expander of FIG. 2 as a function of the RMS substrate surface roughness $MSR_{RMS}$ (nm) for different operating wavelengths λ of 355 nm, 532 nm and 1064 nm, illustrating the impact of the substrate surface roughness on the beam expander optical transmittance and the need to maintain the RMS substrate surface roughness below a threshold value in order to achieve a high-efficiency optical transmittance of $T_{BE}$>95%.

FIG. 10 is a plot of the transmittance $T_{BE}$ (%) of beam expander 10 versus the RMS substrate surface roughness $MSR_{RMS}$ (nm). The plot shows that an amount of RMS substrate surface roughness $MSR_{RMS}$=3 nm results in an optical transmittance $T_{BE}$ for beam expander 10 of $T_{BE}$=99.75% at $\lambda$=1064 nm, $T_{BE}$=99.00% at $\lambda$=532 nm and $T_{BE}$=97.76% at $\lambda$=355 nm. An RMS substrate surface roughness $MSR_{RMS}$=6 nm results in an optical transmittance $T_{BE}$ for beam expander 10 of $T_{BE}$=97% at λ=1064 nm, $T_{BE}$=96% at λ=532 nm and $T_{BE}$≈90% at λ=355 nm (obtained by extrapolating the curve for 355 nm to an $MSR_{RMS}$ of 6 nm).

The optical transmittance $T_{BE}$ of beam expander 10 is limited by the scattering loss at the UV operating wavelength of λ=355 nm. In other words, according to the plot of FIG. 10, mirrors 20 and 30 of beam expander 10 each need to have an RMS substrate surface roughness $MSR_{RMS}$<4.5 nm for the beam expander to have a high-efficiency optical transmittance of $T_{BE}$>95%.

As discussed above, reflective multilayer coating 24 or 34 has multiple $HfO_2/SiO_2$ stacks or sections SN, such as sections S1 through S3, wherein the $HfO_2/SiO_2$ layer thicknesses $\tau_H/\tau_S$ generally decrease section by section, from the first or lowermost section S1 closest to mirror substrate 21 or 31 to the top or uppermost section S3 that defines top surface 26 or 36 of the reflective multilayer coating.

The $HfO_2/SiO_2$ layers of section S3 are configured to provide high reflectance in the UV at λ=355 nm while being substantially transmissive to the VIS, NIR and MWIR wavelengths. Forming section S3 as the top or uppermost section ensures that there is the lowest amount of scattering loss for the shortest operating wavelength. In other words, the UV operating wavelength has the shortest optical-path length within reflective multilayer coating 24 or 34, thereby providing the lowest amount of scatter loss. Although this approach may increase the amount of scatter loss at the IR operating wavelength due to the IR light having to traverse the longest optical-path length within reflective multilayer coating 24 or 34, the scatter loss is not as sensitive at this longer NIR wavelength as compared to at the shorter UV wavelength.

Thus, the configuration of reflective multilayer coating 24 or 34 such as is shown in FIG. 6, where the top or uppermost section S1 defines the reflectance for the shorter UV operating wavelength and the bottom or lowermost section S3 defines the reflectance of the longer IR operating wavelength, is exploited to optimize the optical transmittance $T_{BE}$ of beam expander 10 and achieve the high-efficiency optical transmittance of $T_{BE}$>95%.

Forming the $HfO_2/SiO_2$ Layers

The plots of FIGS. 9 and 10 indicate that achieving an optical transmittance $T_{BE}$>95% for beam expander 10 requires that the amount of RMS substrate surface roughness $MSR_{RMS}$ be maintained below a certain threshold value TV, such as TV=4.5 nm in the example discussed above. This requires forming the $HfO_2/SiO_2$ layers in each of the reflective multilayer coatings 24 and 34 so that they are as smooth as possible.

In an example, the $HfO_2/SiO_2$ layers are formed using the systems and methods disclosed in the '450 patent. In particular, in an example, the $HfO_2/SiO_2$ layers are formed on the respective diamond-turned and optically polished substrate surfaces 22 and 32 of mirror substrates 21 and 31 using plasma ion assisted deposition (PIAD) in combination with rotating the respective mirror substrate and employing a "reversed mask" process. This method ensures that reflective multilayer coatings 24 and 34 do not increase the RMS substrate surface roughness $MSR_{RMS}$ beyond that of the original diamond-turned and optically polished substrate surfaces 22 and 32.

Thus, in an example, the diamond-turned and optically polished substrate surfaces 22 and 32 of mirror substrates 21 and 31 each has a RMS substrate surface roughness $MSR_{RMS}$ less than a threshold value TV, such as the aforementioned 4.5 nm, which results in an optical transmittance $T_{BE}$>95% for all the operating (design) wavelengths λ. Such threshold values TV are readily achievable using diamond-turning and polishing of an Al surface.

Mitigating Surface Defects

In some instances, substrate surface 22 or 32 can have surface imperfections or defects that need to be smoothed out or otherwise mitigated to achieve a high-efficiency optical transmittance $T_{BE}$ for beam expander 10. For example, metal inclusions are sometimes formed in aluminum (Al) alloys to increase the mechanical strength. The metal inclusions can have a hardness different from that of the bulk Al alloy of mirror substrate 21 or 31 and can appear in the form of small (e.g., submicron-size) particles on the polished substrate surface 22 or 32. Such surface defects can increase scatter loss SL and may also reduce the laser-induced damage threshold, especially at the UV operating wavelength.

In one example, surface defects can be mitigated by the depositing of an $SiO_2$ layer on substrate surface 22 or 32 to seal the surface defect while eliminating defect lateral growth with an inversed mask, followed by the smoothing of the $SiO_2$-coated surface via plasma-ion etching. In another example, a pure Al film is deposited on substrate surface 22 or 32 to seal the surface imperfection and homogenize the surface, followed by optical polishing the pure Al film. In another example, a layer of aluminum is deposited on substrate surface 22 or 32 to seal the surface imperfection and homogenize the surface, and then the Al-coated surface is smoothed via plasma-ion etching. In another example, a metal such as nickel or a nickel alloy is deposited on substrate surface 22 or 32 and then the coated substrate is processed to define the require curvature to within a desired surface roughness.

Figure 11A:
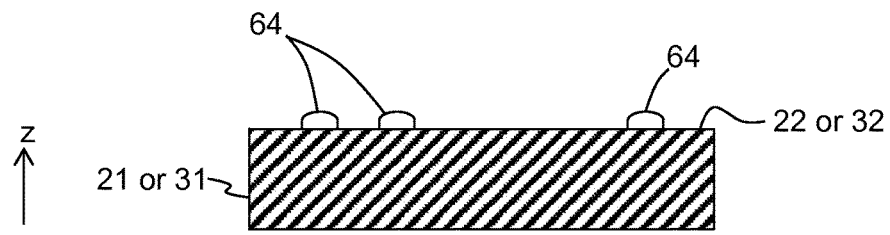
FIGS. 11A through 11C are schematic side views that illustrate an example method of mitigating defects on the substrate surface using an intermediate $SiO_2$ layer that is processed using plasma-ion etching prior to the formation of the $HfO_2/SiO_2$ reflective multilayer coating as disclosed herein.
Figure 11B:
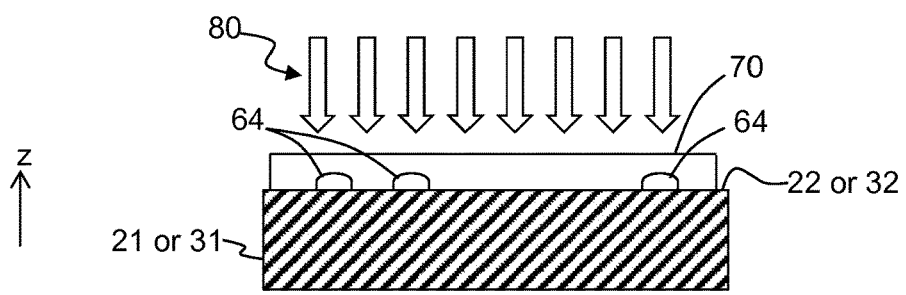
Figure 11C:
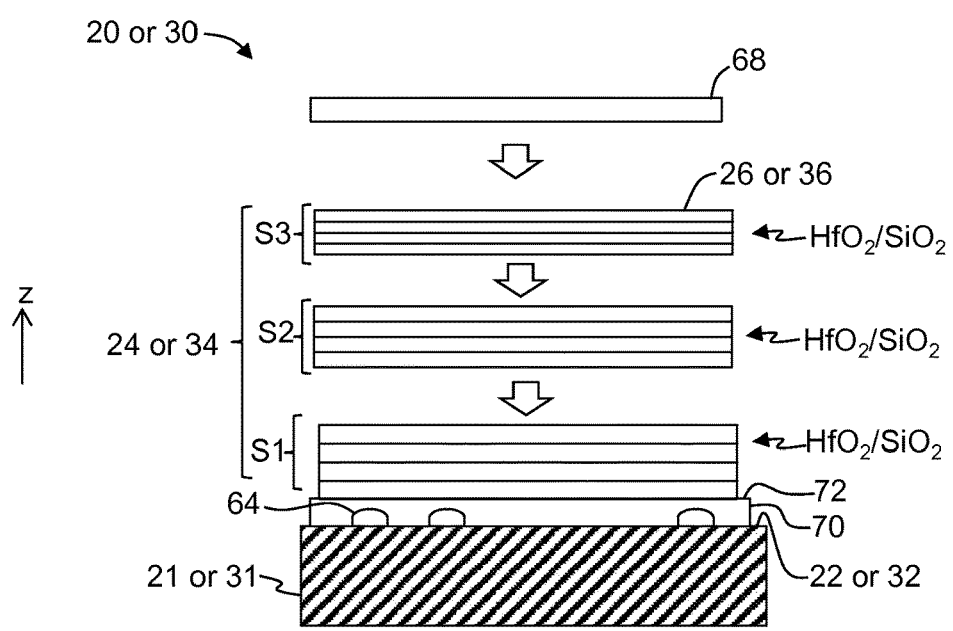

FIGS. 11A through 11C are schematic side views of a portion of an example mirror 20 or 30 that illustrates an example method of performing surface-defect mitigation when the mirrors are formed. In FIG. 11A, substrate surface 22 or 32 of mirror substrate 21 or 31 includes surface defects 64. In FIG. 11B, substrate surface 22 or 32, and the surface defects 64 thereon, are coated with an $SiO_2$ layer 70 using a reversed mask process. The $SiO_2$ layer 70 is then plasma-ion etched using a plasma-ion etch process that employs a plasma 80 to form a flat (i.e., substantially defect-free) surface 72. The reflective multilayer coating 24 or 34 consisting of the aforementioned $HfO_2/SiO_2$ layers is then formed atop surface 72 of processed $SiO_2$ layer 70, as shown in FIG. 11C. The optional $SiO_2$ layer 68 is also shown in FIG. 11C as being deposited atop the uppermost section S3 of reflective multilayer coating 24 or 34.

The resulting mirrors 20 and 30 are then employed in beam expander 10 to achieve the multiwavelength performance over the UV, VIS and NIR wavelengths with a high-efficiency optical transmittance $T_{BE}$>95%.

An advantage of beam expander 10 disclosed herein is that reflective multilayer coatings 24 and 34 can have a relatively high laser-induced damage threshold at all the operating wavelengths λ. The $HfO_2/SiO_2$ layers are formed to be dense and smooth to reduce or otherwise minimize scatter loss SL while also being resistant to laser damage and environmental erosion. When necessary, substrate surface defect mitigation is carried out as described above to reduce or eliminate the adverse effects of substrate surface defects on the optical transmittance $T_{BE}$ of beam expander 10. Further, because reflective multilayer coatings 24 and 34 are formed in sections SN that are designed to reflect a particular operating wavelength λ while substantially transmitting other wavelengths, substrate surfaces 22 and 32 of mirrors 20 and 30 can have a relatively high reflectance at MWIR wavelengths.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A beam-expander optical system, comprising:
a convex mirror having a first mirror substrate made of a metal and having a convex substrate surface and a first reflective multilayer coating formed on the convex substrate surface;
a concave mirror having a second mirror substrate made of the metal and having a concave substrate surface and a second reflective multilayer coating formed on the concave substrate surface, with the convex and concave mirrors being arranged in an off-axis, afocal configuration having greater than unity magnification;
wherein the first and second reflective multilayer coatings each includes alternating layers of $HfO_2$ and $SiO_2$ that define at least first and second sections S1 and S2, wherein the first section S1 has a layer of $SiO_2$ immediately adjacent the convex or concave substrate surface and is configured to optimally reflect an infrared (IR) wavelength of light and substantially transmit mid-wavelength IR (MWIR) light, wherein the second section S2 resides atop the first section and is configured to optimally reflect a visible wavelength of light and wherein the second section S2 substantially transmits the MWIR light; and
wherein the beam-expander optical system has an optical transmittance $T_{BE}$>95% for the IR and visible wavelengths of light.

2. The beam-expander optical system according to claim 1, wherein the first and second reflective multilayer coatings each include:
a third section S3 atop the second section S2 and configured to optimally reflect a ultraviolet (UV) wavelength of light and substantially transmit the MWIR light to define an optical transmittance $T_{BE}$>95% at the UV wavelength of light.

3. The beam-expander optical system according to claim 1, wherein the metal is an aluminum alloy that defines a housing, and wherein the first and second mirror substrates are formed integrally with the housing.

4. The beam-expander optical system according to claim 1, wherein the first and second substrate surfaces have a root-mean-square (RMS) substrate surface roughness $MSR_{RMS}$ of less than 4.5 nm.

5. The beam-expander optical system according to claim 1, wherein the metal is an aluminum alloy.

6. The beam-expander optical system according to claim 2, wherein the $HfO_2$ and $SiO_2$ layers have respective layer thicknesses $\tau_H$ and $\tau_S$, and wherein the layer thicknesses $\tau_H$ and $\tau_S$ in section S2 are smaller on average than those in section S1 and the layer thicknesses $\tau_H$ and $\tau_S$ in section S3 are smaller on average than those in section S2.

7. The beam-expander optical system according to claim 6, wherein:
for section Si: 130 nm≤$\tau_H$≤140 nm and 90 nm≤$\tau_S$≤190 nm; and
for section S3: 40 nm≤$\tau_H$≤50 nm and 60 nm≤$\tau_S$≤70 nm.

8. The beam-expander optical system according to claim 1, wherein the first and second reflective multilayer coatings each includes an uppermost capping layer of $SiO_2$.

9. The beam-expander optical system according to claim 2, wherein each of the first and second mirrors has a reflectance R>98% at each of the UV wavelength, the VIS wavelength and the IR wavelength.

10. A high-efficiency beam-expander optical system for use at ultraviolet (UV), visible (VIS) and infrared (IR) operating wavelengths, comprising:
a first mirror with a convex substrate surface formed on a first Al alloy substrate and a second mirror with a concave substrate surface formed on a second Al alloy substrate, with the first and second mirrors arranged in an off-axis, afocal configuration having greater than unity magnification;
wherein the convex and concave substrate surfaces each includes a multilayer reflective coating formed from alternating layers of $HfO_2$ and $SiO_2$ having respective layer thicknesses $\tau_H$ and $\tau_S$;
wherein each multilayer reflective coating includes: i) a first section having an $SiO_2$ layer immediately adjacent the convex or concave substrate surface and configured to optimally reflect the IR operating wavelength and substantially transmit a mid-wavelength IR (MWIR) wavelength; ii) a second section atop the first section and configured to optimally reflect the VIS operating wavelength and substantially transmit the IR and MWIR operating wavelengths; and iii) a third section atop the second section and configured to optimally reflect the UV operating wavelength and substantially transmit the VIS, IR and MWIR wavelengths; and
wherein the respective $HfO_2$ and $SiO_2$ layer thicknesses $\tau_H$ and $\tau_s$ are substantially constant within each section but are smaller in the second section on average than in the first section and in the third section on average than in the second section; and
wherein the beam-expander optical system has an optical transmittance $T_{BE}$>95% at the UV, the VIS and the IR operating wavelengths.

11. The high-efficiency beam-expander optical system according to claim 10, wherein the convex substrate surface and the concave substrate surface have a root-mean- square (RMS) substrate surface roughness $MSR_{RMS}$ of less than 4.5 nm.

12. The high-efficiency beam-expander optical system according to claim 10, wherein the UV light has an operating wavelength of 355 nm, the VIS light has an operating wavelength of 532 nm, and the IR light has an operating wavelength of 1064 nm.

13. The high-efficiency beam-expander optical system according to claim 10, further including a housing made of aluminum alloy Al-6061T1, and wherein the first and second mirror substrates are formed integrally with the housing.

14. The high-efficiency beam-expander optical system according to claim 10, wherein:
the layer thicknesses $\tau_H$ and $\tau_S$ of the $HfO_2$ and $SiO_2$ layers in the first section are 130 nm≤$\tau_H$≤140 nm and 90 nm≤$\tau_S$≤190nm; and
the layer thicknesses $\tau_H$ and $\tau_s$ of the $HfO_2$ and $SiO_2$ layers in the third section are 40 nm≤$\tau_H$≤50 nm and 60 nm≤$\tau_S$≤70 nm.

* * * * *

UNITED STATES PATENT AND TRADEMARK OFFICE
CERTIFICATE OF CORRECTION

PATENT NO. : 10,502,965 B2  
APPLICATION NO. : 14/854739  
DATED : December 10, 2019  
INVENTOR(S) : Jue Wang Page 1 of 1

It is certified that error appears in the above-identified patent and that said Letters Patent is hereby corrected as shown below:

On the Title Page

In Column 1, item (73), Assignee, Line 1, delete "Coming, NY" and insert -- Corning, NY --, therefor.

In the Claims

In Column 11, Line 64, Claim 7, delete "Si:" and insert -- S1: --, therefor.

In Column 12, Line 63 (approx.), Claim 14, delete "$\tau_s$of" and insert -- $\tau_S$ of --, therefor.

Signed and Sealed this  
Twenty-fifth Day of February, 2020

Andrei Iancu  
*Director of the United States Patent and Trademark Office*